(12) United States Patent
Takeuchi et al.

(10) Patent No.: US 6,703,864 B2
(45) Date of Patent: Mar. 9, 2004

(54) BUFFER CIRCUIT

(75) Inventors: Junichi Takeuchi, Tokyo (JP); Fumio Nakano, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/728,103

(22) Filed: Dec. 1, 2000

(65) Prior Publication Data

US 2001/0013794 A1 Aug. 16, 2001

(30) Foreign Application Priority Data

Dec. 1, 1999 (JP) .......................................... 11-342453

(51) Int. Cl.⁷ ..................... H03K 19/094; H03K 19/003
(52) U.S. Cl. ............................... 326/73; 326/33; 326/83
(58) Field of Search ...................... 326/73, 74, 80–83, 326/86, 87, 33

(56) References Cited

U.S. PATENT DOCUMENTS

| | | | | |
|---|---|---|---|---|
| 4,912,347 A | * | 3/1990 | Morris | 326/66 |
| 5,495,184 A | * | 2/1996 | Des Rosiers et al. | 326/73 |
| 5,703,497 A | * | 12/1997 | Min | 326/33 |
| 5,963,053 A | | 10/1999 | Manohar et al. | |
| 6,054,874 A | * | 4/2000 | Sculley et al. | 326/83 |
| 6,111,431 A | * | 8/2000 | Estrada | 326/83 |

FOREIGN PATENT DOCUMENTS

| | | | | |
|---|---|---|---|---|
| JP | 404306915 A | * | 10/1992 | 326/73 |
| JP | 8-172350 | | 7/1996 | |
| JP | 8-191243 | | 7/1996 | |

OTHER PUBLICATIONS

Copy of Korean Office Action dated Mar. 26, 2003 (and English translation of relevant portion).
Korean Office Action with English translation.

* cited by examiner

*Primary Examiner*—James H Cho
(74) *Attorney, Agent, or Firm*—Dickstein, Shapiro, Morin & Oshinsky, LLP.

(57) ABSTRACT

An output buffer circuit of a Pseudo Emitter Coupled Logic (PECL) uses a common level which is generated by a resistance division so that the common level is unstable to follow to a gradient of power source variation and an output signal level of the output buffer circuit is apt to be off from a level of the PECL. An output buffer circuit of PECL according to the present invention comprises: a first output terminal; a second output terminal; a first resistor connected between the first output terminal and a output terminal of a common level generator; a second resister connected between the second output terminal and the output terminal of the common level generator; and a driver circuit which makes a current from the first output terminal to the second output terminal through the first resistor and second resistor when a first input signal and a second input signal complementary to the first input signal result a first data, and makes a current from the second output terminal to the first output terminal through the second resistor and the first resistor when the first input signal and the second input signal result a second data; a common level which follows its fluctuation to that of power source is supplied to the connecting point of the first and second resistors.

10 Claims, 7 Drawing Sheets

BUFFER CIRCUIT

BACKGROUND OF THE INVENTION

1. Field of the Invention

The present invention relates to a buffer circuit, and more patticularly to a PECL (Pseudo Emitter Coupled Logic) buffer circuit for use in electric input and output sections of an optical interface module.

2. Description of the Related Art

PECL signal levels which include a high level of +4 V and a low level of +3 V. are used particularly in optical interfaces between LSI circuits. Though no problems are posed on signal levels for connection between ECL circuits and connection between PECL circuits, it is difficult to provide a complete level assurance when PECL signal levels are generated by CMOS components because the range of PECL signal levels is narrow.

In recent years, high-speed optical interfaces for handling high frequencies of several tens MHz or higher have begun to be used as general-purpose interfaces, and there is a demand for low-cost high-speed optical interfaces with related ICs constructed as CMOS ICs. One PECL buffer circuit which satisfies such a demand is disclosed in Japanese patent Application laid-open No. 8-172350.

FIG. 1 of the accompanying drawings shows the disclosed PECL buffer circuit. As shown in FIG. 1, the PECL buffer circuit has input terminals 40, 41 for being supplied with respective PECL signals that are complementary to each other. Input terminal 40 is connected to the gates of PMOS transistor 42 and NMOS transistor 44. Input terminal 41 is connected to the gates of PMOS transistor 43 and NMOS transistor 45. PMOS transistors 42, 43 have respective sources connected to a power supply VEE (+4 V). The drain of PMOS transistor 42 is connected to the drain of NMOS transistor 44, and the drain of PMOS transistor 43 is connected to the drain of NMOS transistor 45. The sources of NMOS transistors 44, 45 are connected to constant current source 50 that is connected to ground (GND). A current of 10 mA flows through constant current source 50. Output pad 48 has a terminal connected to the drain of PMOS transistor 43, and output pad 49 has a terminal connected to the drain of NMOS transistor 44. The other terminals of output pads 48, 49 are connected to respective terminals of load resistors 46, 47 which are connected in series with each other and which each has a resistance of 50 Ω.

Operation of the PECL buffer circuit shown in FIG. 1 will be described below. For instance, a high-level signal of +4 V is applied to input terminal 41 and a low-level signal of 3 V is applied to input terminal 40, PMOS transistor 42 and NMOS transistor 45 are turned on, causing a current of 10 mA to flow from output pad 49 to output pad 48 via load resistors 47, 46. Therefore, a potential difference of 1 V is developed between the opposite terminals of load resistors 47, 46. Output pad 49 maintains a high-level voltage of +4 V, whereas output pad 48 maintains a low-level voltage of +3 V. Conversely, when a low-level signal of −3 V is applied to input terminal 41 and a high-level signal of +4 V is applied to input terminal 40, PMOS transistor 43 and NMOS transistor 44 are turned on, causing a current of 10 mA to flow from output pad 48 to output pad 49 via load resistors 46, 47. Therefore, output pad 49 maintains a low-level voltage of +3 V, whereas output pad 48 maintains a high-level voltage of +4 V. The buffer circuit serves as a differential output buffer circuit of CMOS components for outputting PECL signals. Actually, 3.3 V is applied for the high level signal and 0 V is applied for the low level signal, usually.

In the conventional PECL buffer circuit, a common level Vcom at junction node N between load resistors 46, 47 tends to vary, and cannot sufficiently catch up with variations in the power supply voltage. Therefore, the components suffer variations, and when the power supply voltage varies, the level of the output signal from the PECL buffer circuit may possibly fall out of the PECL signal level range.

SUMMARY OF THE INVENTION

It is an object of the present invention to provide a buffer circuit which comprises CMOS components in view of power supply voltage fluctuations and which satisfies PECL signal levels.

According to the present invention, there is provided a buffer circuit for driving an optical module, comprising a current-drive-type driver circuit of CMOS components, and a common level generating circuit for supplying a common level to a pseudo emitter coupled logic signal outputted from the current-drive-type driver circuit.

The current-drive-type driver circuit comprises a first constant current source connected to a first power supply, a first MOS transistor of a first conductivity type having a source connected to the first constant current source and a gate for being supplied with a first input signal, a second MOS transistor of the first conductivity type having a source connected to the first constant current source and a gate for being supplied with a second input signal complementary to the first input signal, a third MOS transistor of a second conductivity type having a drain connected to the drain of the first MOS transistor and a gate for being supplied with the first input signal, a fourth MOS transistor of the second conductivity type having a drain connected to the drain of the second MOS transistor and a gate for being supplied with the second input signal, and a second constant current source connected between the sources of the third and fourth MOS transistors and a second power supply.

Preferably, the buffer circuit also has a first output terminal connected to the drains of the first MOS transistor and the third MOS transistor, a first resistor having a terminal connected to the first output terminal and another terminal connected to an output terminal of the common level generating circuit, a second output terminal connected to the drains of the second MOS transistor and the fourth MOS transistor, and a second resistor having a terminal connected to the second output terminal and the other terminal connected to the output terminal of the common level generating circuit.

Preferably, the common level has variations at a gradient which is substantially the same as the gradient of variations of a power supply voltage, and the common level lies intermediate between high and low levels of the pseudo emitter coupled logic signal substantially at all times.

The common level generating circuit comprises means for generating a first constant current in response to a constant potential, a third resistor having a terminal connected to a power supply, a second current mirror circuit for being supplied with the first constant current, the second current mirror circuit being connected to another terminal of the third resistor for outputting a voltage of the power supply, and a first voltage-follower-type operational amplifier for being supplying with a second constant current flowing through the third resistor and outputting the common level.

The means for generating the first constant current comprises a second voltage-follower-type operational amplifier for being supplied with the constant potential, a fourth resistor connected between a node which is set to the constant potential by the second voltage-follower-type operational amplifier and a ground power supply, for passing a third constant current therethrough, and a first current mirror for being supplied with the third constant current and outputting the first constant current.

The first current mirror circuit comprises a pair of transistors which have respective sizes identical to each other, the second current mirror circuit comprises a pair of transistors which have respective sizes identical to each other, and the third and fourth resistors have respective resistances identical to each other.

According to the present invention, there is also provided a buffer circuit comprising a first output terminal, a second output terminal, a first resistor connected between the first output terminal and a set connecting terminal of a common level output terminal, a second resistor connected between the second output terminal and the set connecting terminal, and a driver circuit responsive to a first signal and a second signal complementary to the first signal, for passing a current from the first output terminal to the second output terminal via the first resistor and the second resistor when the first signal and the second signal represent first data, and passing a current from the second output terminal to the first output terminal via the second resistor and the first resistor when the first signal and the second signal represent second data the buffer circuit being such that a common level whose variations follow variations of a power supply voltage is supplied to the common level output terminal.

The driver circuit comprises a first constant current source connected to a first power supply, a first MOS transistor of a first conductivity type having a source connected to the first constant current source, a gate for being supplied with a first input signal, and a drain connected to the first output terminal, a second MOS transistor of the first conductivity type having a source connected to the first constant current source, a gate for being supplied with a second input signal complementary to the first input signal, and a drain connected to the second output terminal, a third MOS transistor of a second conductivity type having a drain connected to the first output terminal and a gate for being supplied with the first input signal, a fourth MOS transistor of the second conductivity type having a drain connected to the second output terminal and a gate for being supplied with the second input signal, and a second constant current source connected between the sources of the third and fourth MOS transistors and a second power supply.

The buffer circuit further comprises a common level generating circuit for generating the common level, the common level generating circuit comprising means for generating a first constant current in response to a constant potential, a third resistor having one terminal connected to a power supply, a second current mirror circuit for being supplied with the first constant current, the second current mirror circuit being connected to the other terminal of the third resistor for outputting a voltage of the power supply, and a first voltage-follower-type operational amplifier for being supplying with a second constant current flowing through the third resistor and outputting the common level.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
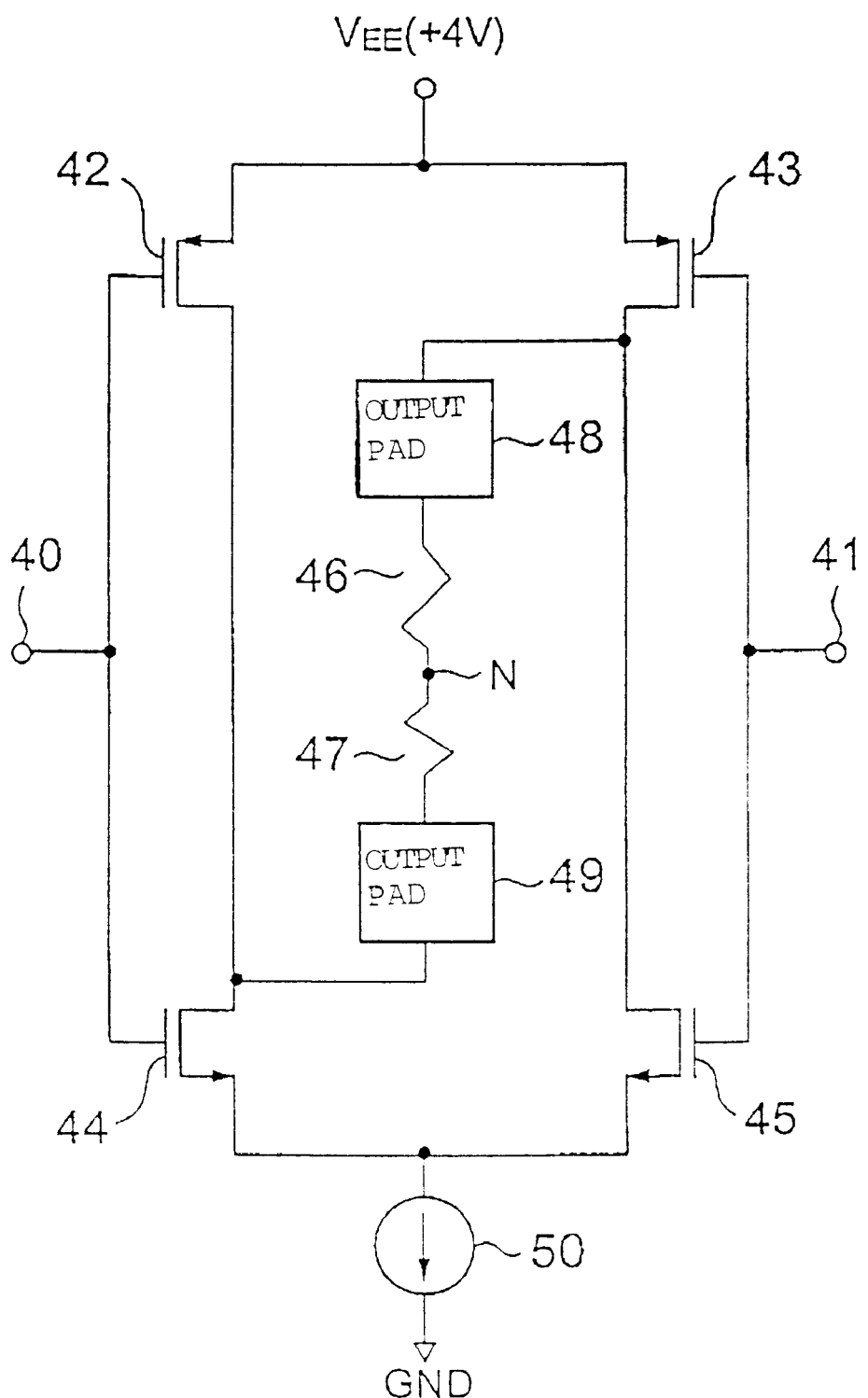
FIG. 1 is a circuit diagram of a conventional PECL buffer circuit.
Figure 2:
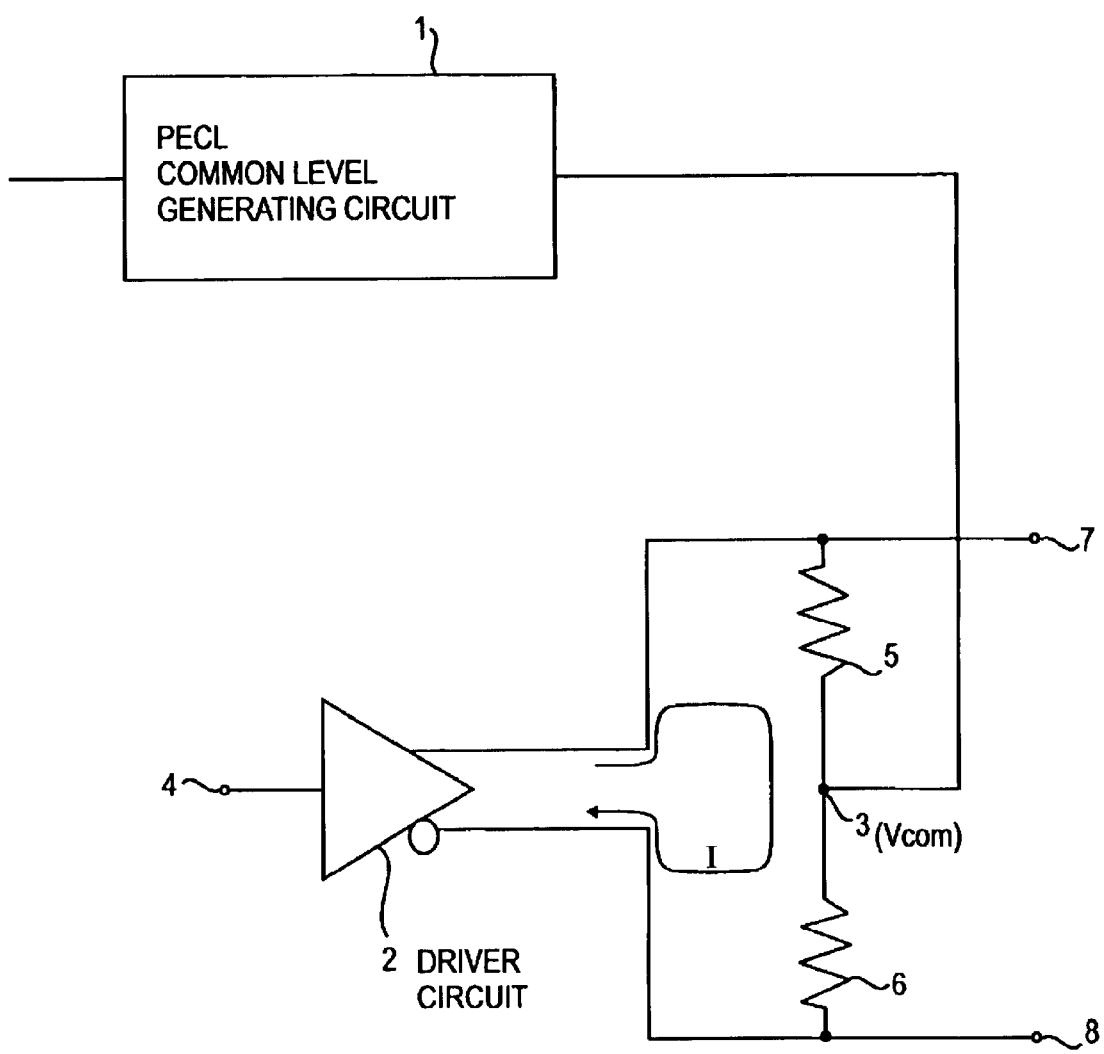
FIG. 2 is a circuit diagram of a PECL buffer circuit according to a first embodiment of the present invention.

FIG. 2 schematically shows a PECL buffer circuit according to a first embodiment of the present invention. As shown in FIG. 2, the PECL buffer circuit comprises current-drive-type driver circuit 2, a pair of resistors 5, 6 connected to output terminals of current-drive-type driver circuit 2, and PECL common level generating circuit 1 for supplying common level Vcom to junction node 3 between resistors 5, and 6. Current-drive-type driver circuit 2 outputs a constant current. Specifically, the direction in which the outputted constant current flows changes when a PECL signal supplied to input terminal 4 of current-drive-type driver circuit 2 changes between data "1" and data "0". For example, when the PECL signal supplied to input terminal 4 of current-drive-type driver circuit 2 is of data "1", constant current I outputted from current-drive-type driver circuit 2 flows in the illustrated direction. when the PECL signal supplied to input terminal 4 of current-drive-type driver circuit 2 is of data "0", constant current I outputted from current-drive-type driver circuit 2 flows in the direction opposite to the illustrated direction.

Current-drive-type driver circuit 2 comprises a differential output circuit, for example. Constant current I and resistors 5, 6 provide an output amplitude, which is outputted as complementary PECL signals from respective output terminals 7, 8. Common level Vcom outputted from PECL common level generating circuit 1 is supplied to node 3 between two resistors 5 and 6 so as to provide a central level of the amplitude. PECL common level generating circuit 1 outputs common level Vcom which follows a power supply voltage. The PECL signal level is a level based on the power supply voltage. With the PECL buffer circuit according to the present invention, since common level Vcom follows the power supply voltage, the common level varies with power supply voltage variations of the output PECL level. Thus, the PECL buffer circuit can output a stable PECL lever that is resistant to power supply voltage variations.

Figure 3:
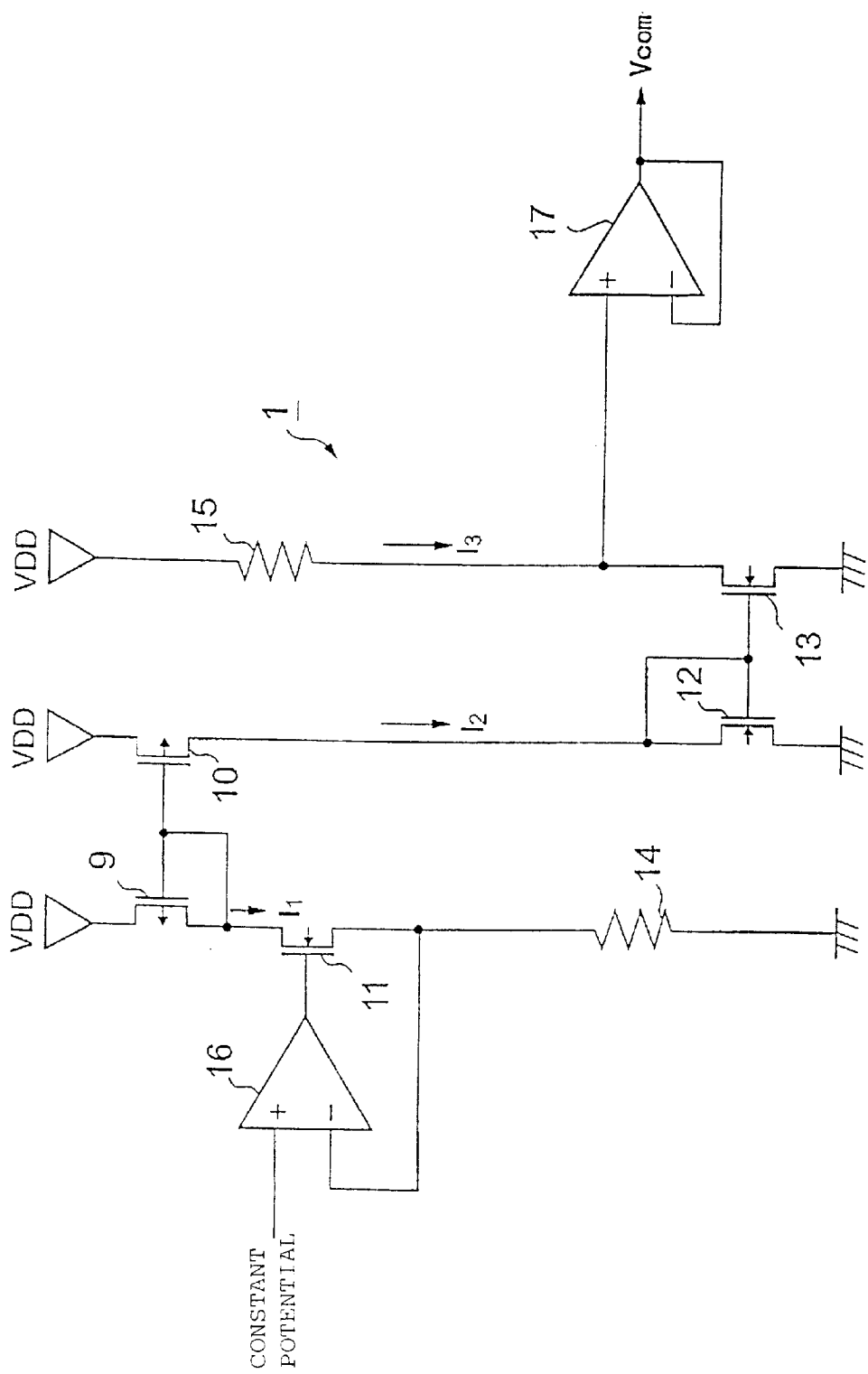
FIG. 3 is a circuit diagram of a PECL common level generating circuit in the PECL buffer circuit shown in FIG. 2.

FIG. 3 shows a circuit arrangement of PECL common level generating circuit 1 in the buffer circuit shown in FIG. 2. PECL common level generating circuit 1 will be described below with reference to FIG. 3.

PMOS transistor 9 has a source connected to a power supply which supplies a power supply voltage VDD whose potential is higher than a ground voltage, and a gate and a drain connected to each other. The drain of PMOS transistor 9 is connected to the drain of NMOS transistor 11. The source of NMOS transistor 11 is connected to a terminal of a resistor 14, whose other terminal is connected to a ground power supply which supplies the ground voltage. The gate of NMOS transistor 11 is connected to voltage-follower-type operational amplifier 16. Operational amplifier 16 has a positive input terminal supplied with a constant potential from a reference potential generating block (not shown), and a negative input terminal connected to the source of NMOS transistor 11. PMOS transistor 10 has a source connected to the power supply and a gate connected to the gate of PMOS transistor 9. Transistors 9, 10 jointly make up a first current mirror.

NMOS transistor 12 has a drain connected to the drain of PMOS transistor 10, a gate connected to the drain thereof, and a source connected to the ground power supply. NMOS transistor 13 has a source connected to the ground power supply and a gate connected to the gate of NMOS transistor 12. Transistors 12, 13 jointly make up a second current mirror.

The first current mirror has input current $I_1$, and output current $I_2$, and second current mirror has input current $I_2$ and output current $I_3$. These currents $I_1$, $I_2$, $I_3$ are identical to each other. Specifically, PMOS transistors 9, 10 have identical sizes, and NMOS transistors 12, 13 have identical sizes. Therefore, each of first and second current mirrors has a mirror ratio of 1. Resistor 15 has a terminal connected to the drain of NMOS transistor 13 and another terminal connected to the power supply. A junction between resistor 15 and NMOS transistor 13 is connected to an input terminal of a voltage-follower=type operational amplifier 17, weigh outputs common level Vcom.

Operation of PECL common level generating circuit 1 will be described below. Voltage-follower-type operational amplifier 16 is supplied with a constant voltage, and the junction between NMOS transistor 11 and resistor 14 is of the same potential as the constant potential inputted to operational amplifier 16. Constant current $I_1$ is determined by the potential at the junction between NMOS transistor 11 and resistor 14 and the resistance of resistor 14. Because of the above-mentioned relationship between the first and second current mirrors, current $I_3$ flowing through resistor 15 is identical to current $I_1$. The resistance of resistor 15 and constant current $I_3$ determine an output constant potential, which is outputted as common level Vcom via voltage follower 17 in order to assure an external circuit driving capability. Circuit resistor 15 is connected to the power supply, an output potential is obtained which follows the power supply voltage VDD. If the resistances of resistors 14, 15 are identical to each other, then resistance variations can be canceled out. For example, when the resistance of resistor 14 increases, reducing constant current $I_1$, the resistance of resistor 15 also increases at the same rate, and constant current $I_3$ produced by resistor 15 is identical to constant current $I_1$. Therefore, even if the resistances change, common level Vcom remains unchanged.

Figure 4:
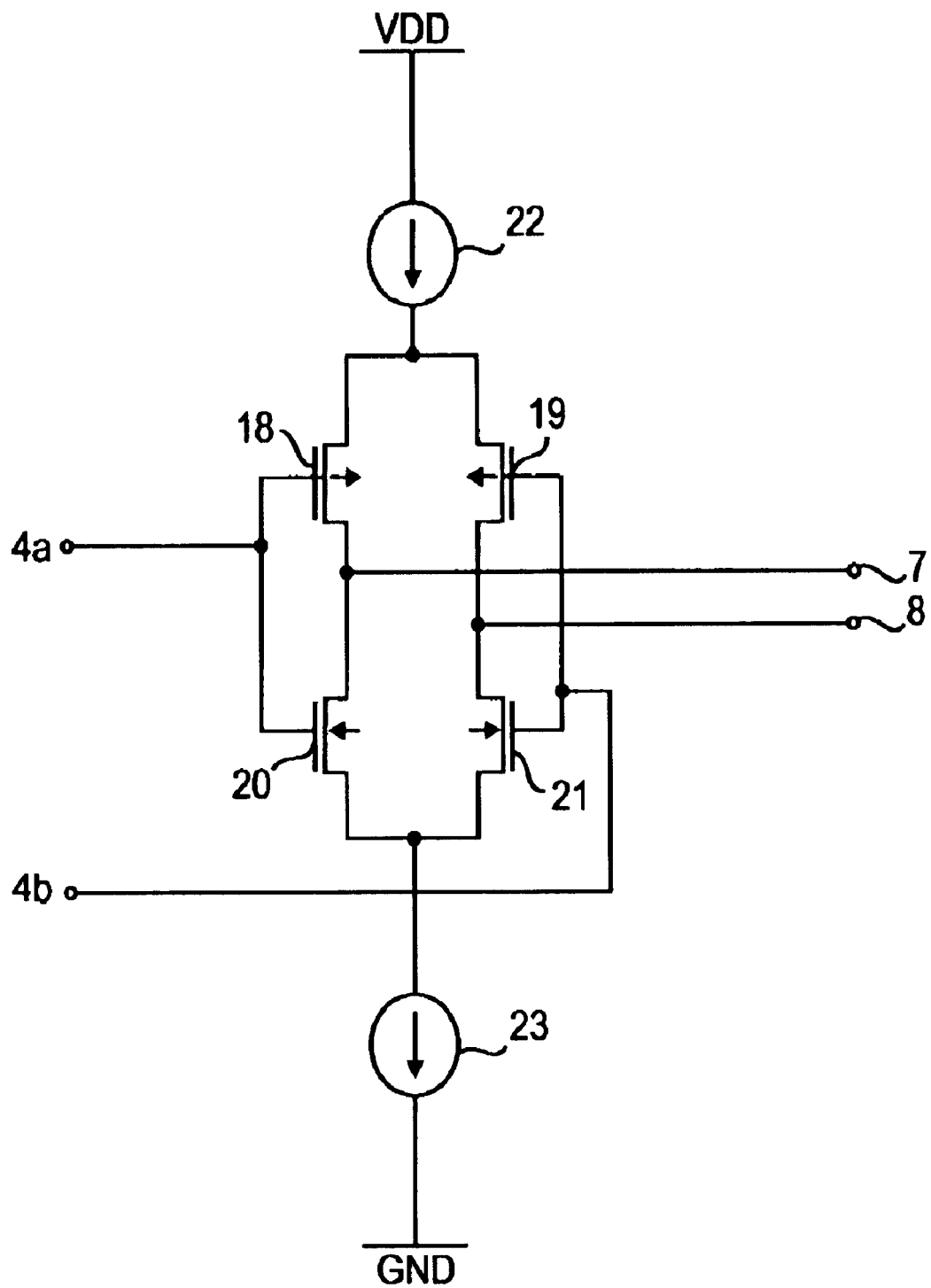
FIG. 4 is a circuit diagram of a current-drive-type driver circuit in the PECL buffer circuit shown in FIG. 2.

FIG. 4 shows a circuit arrangement of current-drive-type driver circuit 2 in the buffer circuit shown in FIG. 2. Current-drive-type driver circuit 2 will be described below with reference to FIG. 4.

PECL signals that are complementary to each other are inputted respectively to input terminals 4a, 4b. Input terminal 4a is connected to the gates of PMOS transistor 18 and NMOS transistor 20. Input terminal 4b is connected to the gates of PMOS transistor 19 and NMOS transistor 21. The sources of PMOS transistors 18, 19 are connected via a constant current source 22 to a power supply which supplies power supply voltage VDD. The sources of NMOS transistors 20, 21 are connected via a constant current source 23 to a ground power supply which supplies a ground voltage. A junction between the drains of transistors 18, 20 is connected to output terminal 7, and a junction between the drains of transistors 19, 21 is connected to output terminal 8. Since current-drive-type driver circuit 2 has two current source, the accuracy of PECL signal levels is increased. Specifically, even when the current supplied from one of the current sources is reduced due to variations of transistors thereof, if a current produced by transistors of the other current source does not vary, then the current from the other current source is maintained up to node 3 shown in FIG. 2, reducing adverse effects to half. Inasmuch as the common level is generated by PECL common level generating circuit 1 and operational amplifier 17 for assuring a driving capability is connected to its output terminal, the driver circuit shown in FIG. 4 can be employed because the difference between the currents from the two current sources can be supplied from and drawn to the operational amplifier. Stated otherwise, the operational amplifier needs to have an allowable input/output current designed to be greater than the difference of the driver.

Operation of the PECL buffer circuit according to the first embodiment will be described below with reference to FIGS. 2 through 4.

For instance, when a high-level PECL signal of +4 V is supplied to input terminal 4a and a low-level PECL signal of +3 V is supplied to input terminal 4b, both NMOS transistor 20 and PMOS transistor 19 are turned on. At this time, transistors 18, 21 are turned off. Therefore, constant current I flows from output terminal 7 to output terminal 8 via resistors 5, 6. At this time, output terminal 7 outputs a voltage which is higher than common level Vcom by a voltage corresponding to constant current I×the resistance of resistor 5, and output terminal 8 outputs a voltage which is lower than common level Vcom by a voltage corresponding to constant current I×the resistance of resistor 6. If the constant current is 10 mA and the resistance of each of resistors 5, 6 is 50 Ω, then a voltage produced across each of resistors 5, 6 is 0.5 V, with a central potential of the voltage being common level Vcom, and an output signal representing the voltage difference (amplitude difference) of 1 V is outputted between output terminals 7, 8.

When a low-level PECL signal of +3 V is supplied to input terminal 4a and a high-level PECL signal of +4 V is supplied to input terminal 4b, the PECL buffer circuit operates in a manner that is a reversal of the above operation.

Though, actually, 3.3V is supplied for high level signal and 0V is supplied for the low level signal, usually.

Such operation of the PECL buffer circuit will not be described below.

Since the PECL buffer circuit according to the present invention has an output buffer using a common level generating circuit which follows the power supply voltage, the PECL buffer circuit is more resistant to power supply voltage variations than the conventional buffer circuit. Such an advantage will be described below with reference to FIGS. 5 and 6.

Figure 5:
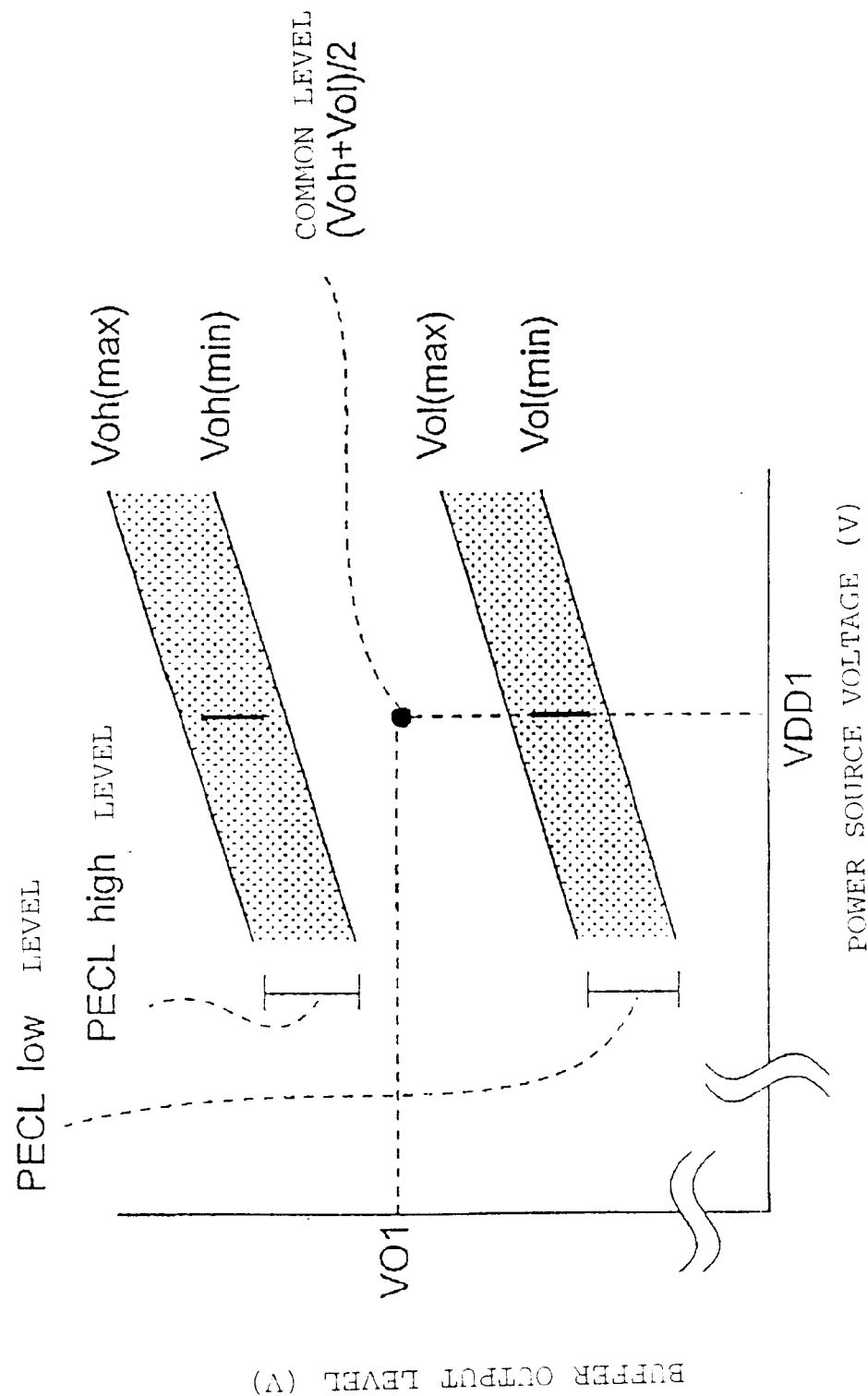
FIG. 5 is a diagram illustrative of standards for PECL signal levels.

FIG. 5 shows standards for high and low PECL signal levels. The graph shown in FIG. 5 has an abscissa representing the power supply voltage (V) and a coordinate axis representing the buffer output potential (V). It can be seen from FIG. 5 that the buffer output potential varies as the power supply voltage varies. The common level lies intermediate between the high level and the low level. It can also be understood from FIG. 5 that in order for a PECL signal level to be properly recognized, the level of data "1" needs to enter between Voh (max) and Voh (min), and the level of data "0" needs to enter between Vol (max) and Vol (min).

Figure 6:
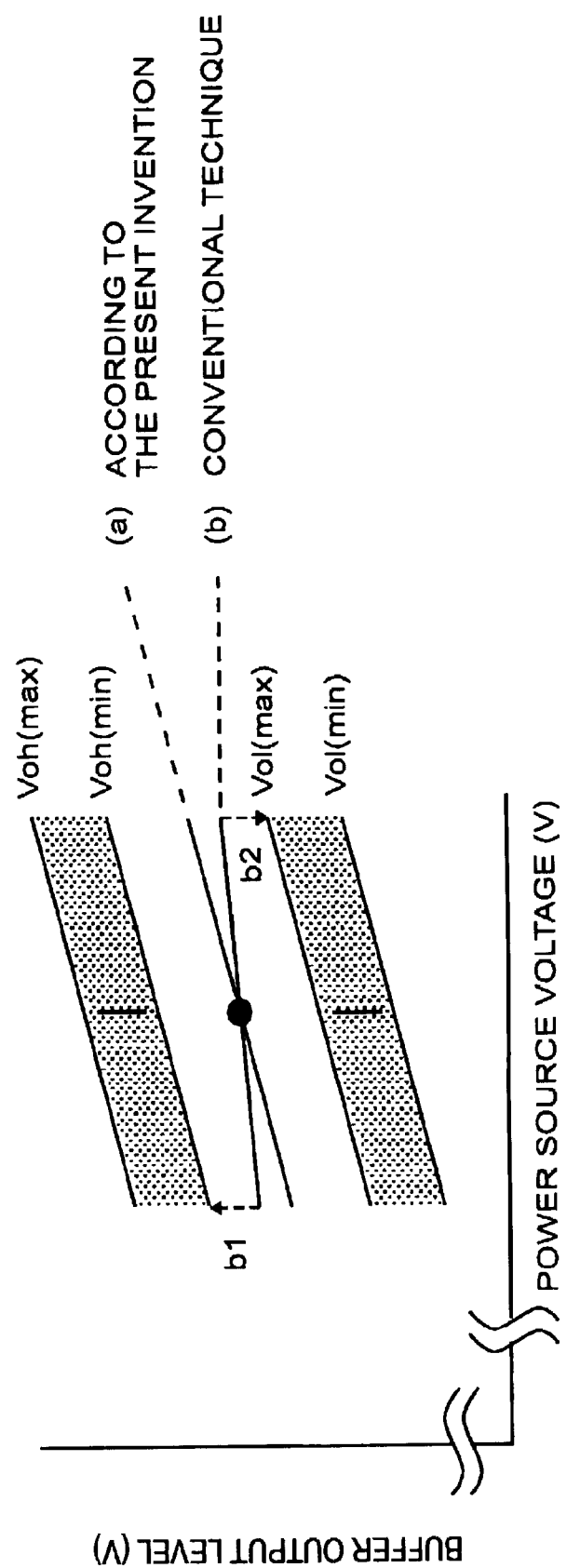
FIG. 6 is a diagram illustrative of the manner in which the PECL buffer circuit according to the first embodiment operates.

FIG. 6 illustrates the manner in which the PECL buffer circuit operates. The graph shown in FIG. 6 has an abscissa representing the power supply voltage (V) and a coordinate axis representing the buffer output potential (V). It can be seen from FIG. 6 that the buffer circuit according to the present invention is more resistant to power supply voltage variations than the conventional buffer circuit. Specifically, common level Vcom in the conventional buffer circuit is directly subject to power supply voltage variations, and hence tends to fluctuate.

Furthermore, since the conventional buffer circuit is unable to absorb variations of components, particularly transistors, common level Vcom suffers variations of threshold values Vt of the transistors in combination with variations of the power supply voltage VDD with the result that the gradient of common level Vcom deviates from the gradient of power supply voltage variations. If node N in the conventional buffer circuit is supplied with a constant potential from a constant potential generating circuit which follows a ground level, common level Vcom follows variations in the ground voltage, but the gradient of common level Vcom is horizontal. In this case, common level Vcom interferes with the PECL signal levels.

However, if the common level generating circuit which follows the power supply voltage is used, then the gradient of common level variations is close to the gradient of power supply voltage variations, and is less liable to be affected thereby.

The PECL buffer circuit according to the present invention which uses the common level generating circuit is more effective to absorb variations of components such as transistors than the conventional buffer circuit.

Consequently, the PECL buffer circuit according to the present invention can produce an output signal which follows power supply voltage variations more closely.

Figure 7:
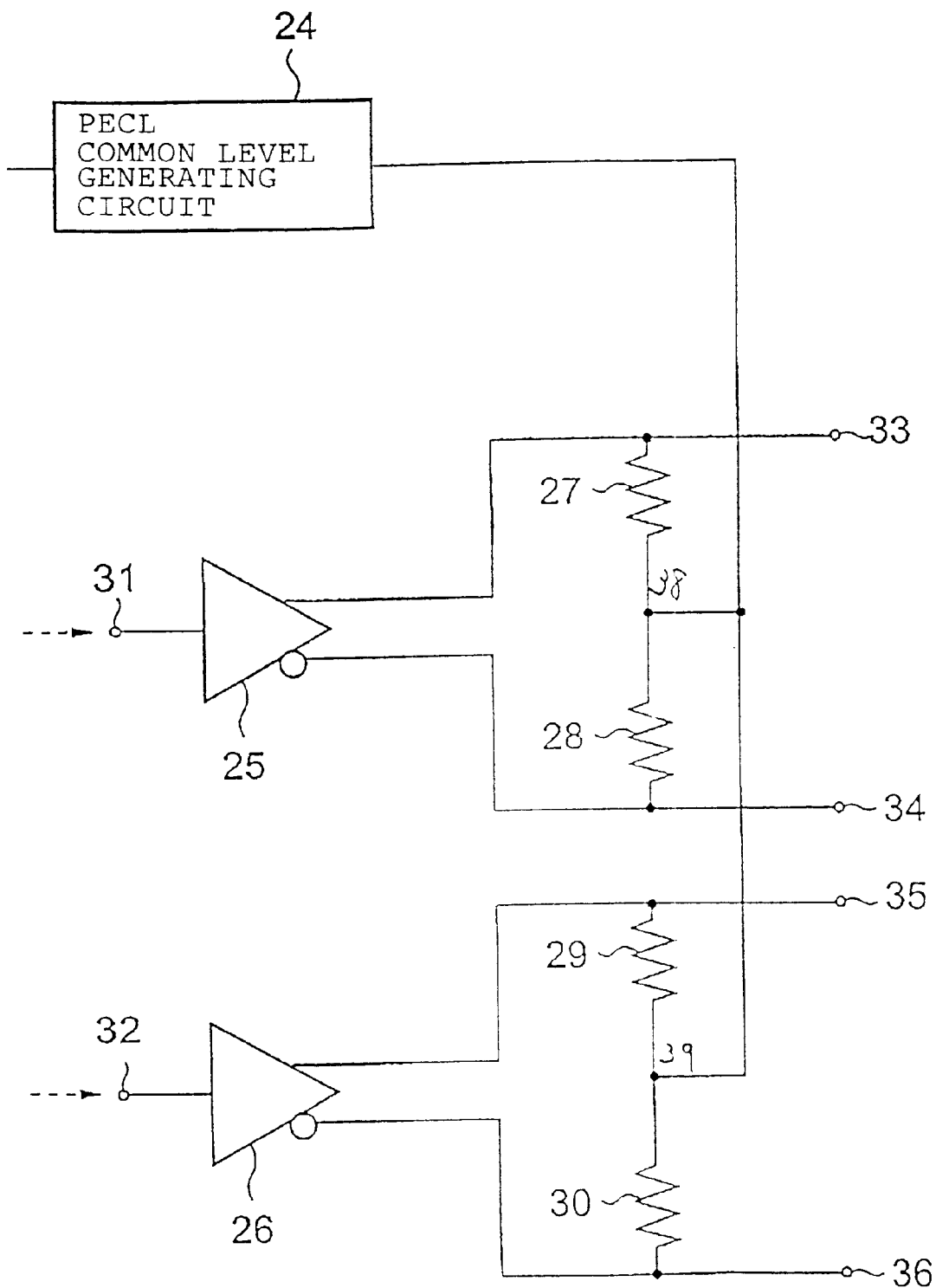
FIG. 7 is a circuit diagram of a PECL buffer circuit according to a second embodiment of the present invention.

FIG. 7 shows a PECL buffer circuit according to a second embodiment of the present invention.

The PECL buffer circuit according to the second embodiment is of basically the same circuit arrangement as the PECL buffer circuit according to the first embodiment but is designed to distribute a common level. As shown in FIG. 7, a common level outputted from a PECL common level generating circuit 24 is distributed to not only an output driver of port 1 but also an output driver of port 2.

More specifically, a first PECL signal is applied to first current-drive-type driver circuit 25 whose complementary output signals are outputted to respective terminals 33, 34, and the common level is supplied to a junction between resistors 27, 28 connected between terminals 33, 34.

Similarly, a second PECL signal is applied to second current-drive-type driver circuit 26 whose complementary output signals are outputted to respective terminals 35, 36, and the common level is supplied to a junction between resistors 29, 30 connected between terminals 35, 36.

PECL common level generating circuit 24 and first and second current-drive-type driver circuits 25, 26 have circuit arrangements which are identical to those shown in FIGS. 3 and 4, and hence their arrangements and operation will not be described below.

The PECL buffer circuit according to the present invention provides a PECL output circuit that is stable and resistant to power supply voltage variations by combining a PECL common level generating circuit which follows a power supply voltage and a current-drive-type driver circuit with each other.

Furthermore, the current-drive-type driver circuit has two constant current sources for producing a stable current to assist in producing a stable PECL output.

The current-drive-type driver circuit is required to have the illustrated arrangement, but may be of any type capable of supplying a constant current.

While preferred embodiments of the present invention have been described using specific terms, such description is for illustrative purposes only, and it is to be understood that changes and variations may be made without departing from the spirit or scope of the following claims.

What is claimed is:

1. A buffer circuit for driving an optical module, comprising:
   a current-drive-type driver circuit consisting of CMOS components; and
   a common level generating circuit for supplying a common level to a pseudo emitter coupled logic signal outputted from said current-drive-type driver circuit, wherein said common level generated by said common level generating circuit has variations at a gradient which is substantially the same as the gradient of variations of a power supply voltage.

2. A buffer circuit according to claim 1, wherein said current-drive-type driver circuit comprises:
   a first constant current source (22) connected to a first power supply; a first MOS transistor (18) of a first conductivity type having a source connected to said first constant current source (22) and a gate for being supplied with a first input signal (4a);
   a second MOS transistor (19) of the first conductivity type having a source connected to said first constant current source (22) and a gate for being supplied with a second input signal (4b) complimentary to said first input signal;
   a third MOS transistor (20) of a second conductivity type having a drain connected to the drain of said first MOS transistor (18) and a gate for being supplied with said first input signal (4a);
   a fourth MOS transistor (21) of the second conductivity type having a drain connected to the drain of said second MOS transistor (19) and a gate for being supplied with said second input signal (4b); and
   a second constant current source connected between the sources of said third and fourth MOS transistors and a second power supply (GND).

3. A buffer circuit according to claim 2, further comprising:
   a first output terminal (7) connected to the drains of said first MOS transistor (18) and said third MOS transistor (20);
   a first resistor (5) having one terminal connected to said first output terminal (7) and other terminal connected to a node (3), that is an output terminal of said common level generating circuit;
   a second output terminal (8) connected to die drains of said second MOS transistor (19) and said fourth MOS transistor (21); and
   a second resistor (6) having one terminal connected to said second output terminal (8) and the other terminal connected to said node (3) of said common level generating circuit.

4. A buffer circuit according to claim 1, wherein said common level lies intermediate between high and low levels of said pseudo emitter coupled logic signal substantially at all times.

5. A buffer circuit according to claim 1, wherein said common level generating circuit comprises:
- means for generating a first constant current ($I_1$) in response to a constant potential;
- a third resistor (15) having one terminal connected to a power supply (VDD);
- a second current mirror for being supplied with said first constant current ($I_1$), said second current mirror being connected to the other terminal of said third resistor (15) for outputting a voltage of said power supply (VDD); and
- a first voltage-follower-type operational amplifier (17) being supplied with a second constant current ($I_3$) flowing through said third resistor (15) and outputting said common level.

6. A buffer circuit according to claim 5, wherein said means for generating the first constant current ($I_1$) comprises:
- a second voltage-follower-type operational amplifier (16) being supplied with said constant potential;
- a fourth resistor (14) connected between a node which is set to said constant potential by said second voltage-follower-type operational amplifier (16) and a ground power supply, for passing a third constant current therethrough; and
- a first current mirror being supplied with said third constant current and outputting said first constant current.

7. A buffer circuit according to claim 6, wherein said first current mirror comprises a pair of transistors (9, 10) which have respective sizes identical to each other, said second current mirror comprises a pair of transistors (12, 13) which have respective sizes identical to each other, and said third and fourth resistors (15, 14) have respective resistances identical to each other.

8. A buffer circuit comprising:
- a first output terminal (7);
- a second output terminal (8);
- a first resistor (5) connected between said first output terminal (7) and a common level output terminal (3);
- a second resistor (6) connected between said second output terminal (8) and said common level output terminal (3); and
- a driver circuit (2) responsive to a first input signal received from a first input terminal (4a) and a second input signal received from a second input terminal (4b) complementary to said first input signal for passing a current from said first output terminal (7) to said second output terminal (8) via said first resistor (5) and said second resistor (6) when said first signal and said second signal represent first data, and passing a current from said second output terminal (8) to said first output terminal (7) via said first resistor (5) and said second resistor (6) when said first signal and said second signal represent second data;
- wherein a common level whose variations follow variations of a power supply voltage is supplied to said common level output terminal (3).

9. A buffer circuit according to claim 8, wherein said driver circuit (2) comprises:
- a first constant current source (22) connected to a first power supply;
- a first MOS transistor (18) of a first conductivity type having a source connected to said first constant current source (22), a gate for being supplied with a first input signal, and a drain connected to said first output terminal (7);
- a second MOS transistor (19) of the first conductivity type having a source connected to said first constant current source (22), a gate for being supplied with a second input signal complementary to said first input signal and a drain connected to said second output terminal (8);
- a third MOS transistor (20) of a second conductivity type having a drain connected to said first output terminal (7) and a gate for being supplied with said first input signal; a fourth MOS transistor (21) of the second conductivity type having a drain connected to said second output terminal (8) and a gate for being supplied with said second input signal; and
- a second constant current source (23) connected between the sources of said third and fourth MOS transistors (20, 21) and a second power supply.

10. A buffer circuit according to claim 9, further comprising:
- a common level generating circuit (1) for generating said common level;
- said common level generating circuit (1) comprising:
- means for generating a first constant current ($I_1$) in response to a constant potential;
- a third resistor (15) having a terminal connected to a power supply;
  - a second current mirror being supplied with said first constant current ($I_1$), said second current mirror being connected to the other terminal of said third resistor (15) for outputting a voltage of said power supply; and
  - a first voltage-follower-type operational amplifier (17) being supplied with a second constant current ($I_1$) flowing through said third resistor (15) and outputting said common level.

* * * * *